(12) United States Patent
Wong et al.

(10) Patent No.: US 8,861,283 B1
(45) Date of Patent: Oct. 14, 2014

(54) SYSTEMS AND METHODS FOR REDUCING LEAKAGE CURRENT IN MEMORY ARRAYS

(75) Inventors: Brian Yung Fun Wong, San Jose, CA (US); Shankar Sinha, San Jose, CA (US); Shih-Lin S. Lee, San Jose, CA (US); Abhishek B. Sharma, San Jose, CA (US)

(73) Assignee: Altera Corporation, San Jose, CA (US)

( * ) Notice: Subject to any disclaimer, the term of this patent is extended or adjusted under 35 U.S.C. 154(b) by 58 days.

(21) Appl. No.: 13/605,428

(22) Filed: Sep. 6, 2012

(51) Int. Cl.
*G11C 7/00* (2006.01)

(52) U.S. Cl.
USPC ...... 365/189.02; 365/113; 365/156; 365/154; 365/189.05; 365/185.21

(58) Field of Classification Search
CPC ............ G11C 7/12; G11C 2207/2227; G11C 11/4072; G11C 29/83
USPC ............ 365/189.02, 156, 227, 203, 154, 190, 365/226
See application file for complete search history.

(56) References Cited

U.S. PATENT DOCUMENTS

| | | | |
|---|---|---|---|
| 2005/0018519 A1* | 1/2005 | Nii | 365/227 |
| 2008/0273402 A1* | 11/2008 | Christensen et al. | 365/190 |
| 2011/0063895 A1* | 3/2011 | Komatsu et al. | 365/156 |

* cited by examiner

*Primary Examiner* — Hoai V Ho
*Assistant Examiner* — Muhammad Islam
(74) *Attorney, Agent, or Firm* — Kwan & Olynick LLP

(57) ABSTRACT

Disclosed are apparatus and devices for programming and operating a programmable memory array portion coupled with a leakage reduction circuit. At the leakage reduction circuit, a frame bias signal that indicates a majority state of the memory array portion can be received. During idle states of the programmable memory array portion, at least one shared bit line of the memory array portion can be selectively biased based on the received frame bias signal. In one aspect, a first one of two bit lines is biased to a first state, while the second one of the two bits lines is biased to a second state that is opposite the first state. In a further aspect, the first state is a same state as the majority state of the memory array portion.

19 Claims, 8 Drawing Sheets

US 8,861,283 B1

SYSTEMS AND METHODS FOR REDUCING LEAKAGE CURRENT IN MEMORY ARRAYS

TECHNICAL FIELD OF THE INVENTION

This invention relates generally to reducing leakage current. More specifically, this invention relates to reducing leakage current in memory arrays.

BACKGROUND

Large memory arrays, such as static read access memory (SRAM) and configurable RAM (CRAM), typically are comprised of a plurality of memory cells that are configurable by biasing selected n-channel metal-oxide-semiconductor (NMOS) or p-channel metal-oxide-semiconductor (PMOS) transistors. NMOS and PMOS integrated circuits have four terminals—a drain, a source, a gate, and a body. Both types of NMOS and PMOS transistors are associated with significant leakage current during an idling state when a bias voltage is not applied across the gate and source.

This leakage current results in increased power usage for devices having large memory arrays, such as programmable logic devices (PLD's), microprocessors, and similar programmable devices. The performance of modern integrated circuits is often limited by power consumption considerations. Circuits with poor power efficiency place undesirable demands on system designers. By way of examples, power supply capacity may need to be increased, thermal management issues may need to be addressed, and circuit designs may need to be altered to accommodate inefficient circuitry.

It would be beneficial to provide improved methods and apparatus for reducing leakage current in memory arrays.

SUMMARY OF THE INVENTION

The following presents a simplified summary of the disclosure in order to provide a basic understanding of certain embodiments of the invention. This summary is not an extensive overview of the disclosure and it does not identify key/critical elements of the invention or delineate the scope of the invention. Its sole purpose is to present some concepts disclosed herein in a simplified form as a prelude to the more detailed description that is presented later.

In one embodiment, a method for programming and operating a programmable memory array portion coupled with a leakage reduction circuit are disclosed. At the leakage reduction circuit, a frame bias signal that indicates a majority state of the memory array portion can be received. For example, a frame can be defined as a column of memory cells of a memory array that share one or more bit lines, while a frame bias signal corresponds to a particular frame. During idle states of the programmable memory array portion, at least one bit line of the memory array portion is selectively biased based on the received frame bias signal.

In one example, one bit line is biased. In another implementation, two bit lines are shared by all memory cells in the memory array portion, and such two bit lines are biased based on the received frame bias signal. In one aspect, a first one of the two bit lines is biased to a first state, while the second one of the two bits lines is biased to a second state that is opposite the first state. In a further aspect, the first state is a same state as the majority state of the memory array portion. In one implementation, the first state equals a state that is programmed into a majority of the memory cells.

In one aspect, a circuit for reducing leakage current in a memory array portion includes a first multiplexer having a first input, a second input, an enable input, and an output that is coupled with a first bit line of the memory array portion. The circuit further comprises a pre-charging transistor for providing a pre-charge signal to the first input of the first multiplexer. The second input of the first multiplexer is arranged to receive a frame bias signal indicating a majority of bit states for the memory array portion. The enable input of the first multiplexer is arranged to receive an enable signal that causes the first multiplexer to switch between outputting onto the first bit line either the frame bias signal during an idle state of the memory array portion or the pre-charge signal during an active state of the memory array portion.

In another method embodiment, a programming code having a plurality of bits that are to be programmed into the memory array is obtained. A programming code having a plurality of bits that are to be programmed into a plurality of frames of a memory array is obtained. For each frame, a majority bit state is determined from the programming code that is to be programmed into such frame. For each frame, a frame bias state is determined based on the majority bit state that is to be programmed into such frame. After each frame is programmed using the programming code, the frame bias state for such frame is selectively applied to the first or second bit line of such frame and a complementary state of the frame bias state for such frame is applied to another of the first or second bit line of such frame.

These and other features of the present invention will be presented in more detail in the following specification of certain embodiments of the invention and the accompanying figures which illustrate by way of example the principles of the invention.

DETAILED DESCRIPTION OF THE SPECIFIC EMBODIMENTS

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

Embodiments of the present invention will be explained in connection with various specific devices, circuits, applications, etc. herein. However, these references are for purposes of illustration only and are not intended to limit the present invention in any way. For example, one or more embodiments of the present invention will be explained using programmable logic devices (PLDs) and technologies related thereto to illustrate the present invention. However, the invention is widely applicable to other devices and in other environments. Moreover, embodiments of the present invention may be used in a wide variety of functions and/or applications.

In this disclosure, a "configurable device" is a programmable device that ultimately contains user logic (that is, the function(s) programmed and implemented in a programmable device by a user, for example an electronic design). Typically, such a device has a volatile memory and must be programmed upon each power-up from a non-volatile memory, though not every configurable device must possess these characteristics. Examples of configurable devices include SRAM PLDs and RAM-based PLDs (for example, Altera FLEX and STRATIX devices).

Figure 1B:
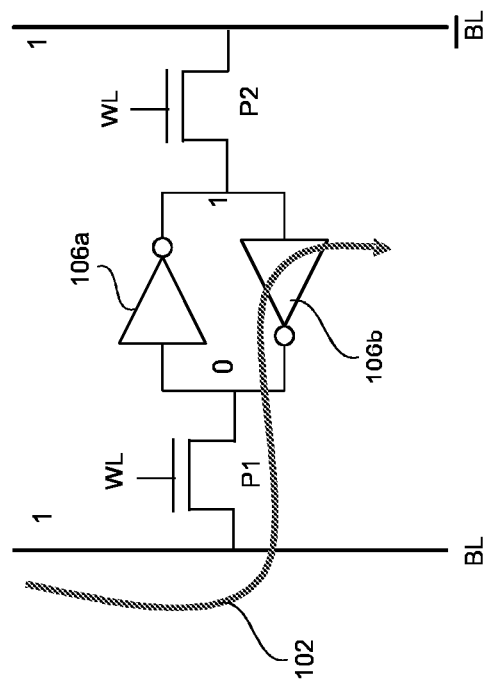
FIG. 1B illustrates a single RAM cell that has been programmed to a state of "1" in an idle state with its bit lines both charged to a supply voltage state of "1."
Figure 1A:
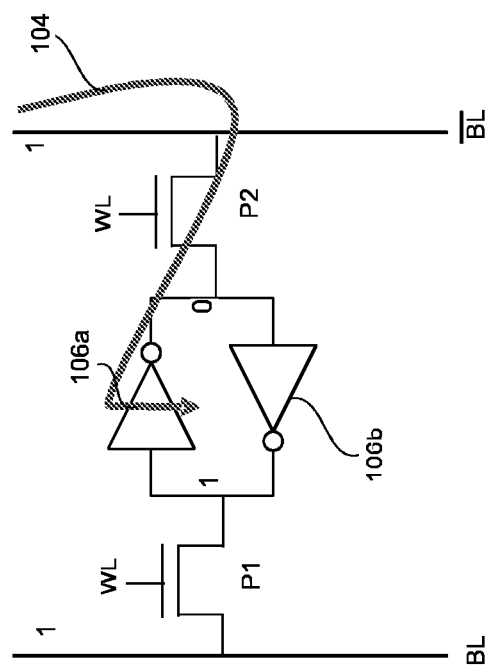
FIG. 1A illustrates a single RAM cell that has been programmed to a state of "0" in an idle state with its bit lines both charged to a supply voltage state of "1."

A programmable device will typically include one or more large memory arrays, each having a plurality of programmable memory cells. The memory cells of each memory array are typically arranged so that individual cells are programmable and accessible via a plurality of word lines and bit lines. FIG. 1A illustrates a single RAM cell that has been programmed to a state of "0" and then left in an idle state during which both bit lines are charged to a supply voltage state of "1." As shown, leakage current flows on path 102 through transistor P1 and inverter 106b during an idle state that biases both bit lines to "1." Likewise, FIG. 1B illustrates the same RAM cell that has been programmed to a state of "1" and then put into an idle state with its bit lines both charged to a supply voltage state of "1." During this idle state, leakage current flows on path 104 through transistor P2 and inverter 106a. The same result would occur if both bit lines were biased to "0."

Regardless of the bit configuration of the individual cells of the RAM, leakage current is still present in each cell of the memory array. That is, if shared bit lines for a group of cells are both charged high (or both charged low), leakage current will be present for each cell through one of the transistor pairs. Thus, large memory arrays, such as configurable read access memory (CRAM), typically have a high total amount of associated leakage current during idle states if both bit lines of each cell group are pulled high during an idle state.

In general, certain embodiments include apparatus and techniques for intelligently biasing individual bit lines of a memory array so as to reduce leakage current during memory idle states. For example, certain embodiments of the present invention intelligently bias a selected one of the shared bit lines to a "1" and bias the other one of the shared bit line to a "0", depending on which cell state ("0" or "1") represents the majority of the cells, which share such bit lines.

Memory cells are described herein as having a "1" or "0" state. In the illustrated example, a "1" corresponds to a high voltage potential, as compared with a low voltage potential that corresponds to a "0" state. Of course, other types of memory cells may utilize any number and values of voltages or currents to represent two or more memory states.

Figure 2:
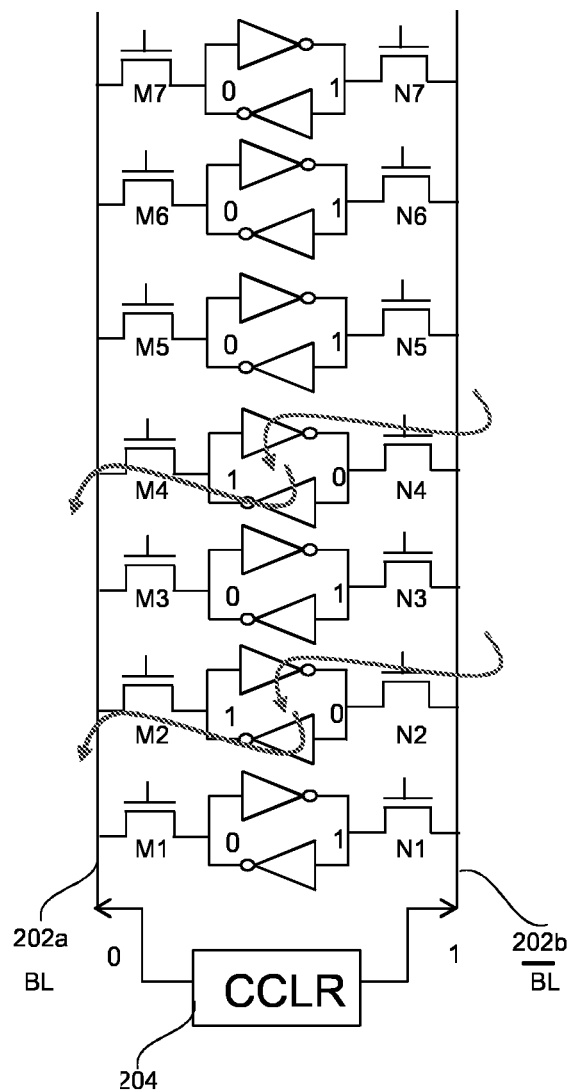
FIG. 2 illustrates a mechanism for intelligently biasing a pair of bit lines, which are shared by a portion of memory cells, in accordance with one embodiment of the present invention.

FIG. 2 illustrates a mechanism for intelligently biasing a pair of bit lines 202a and 202b, which are shared by a portion of memory cells, in accordance with one embodiment of the present invention. The memory array portion may take any suitable form, such as a general non-volatile memory array, CRAM, SRAM, etc. Additionally, embodiments of the present invention may be implemented in any type of device that utilizes a memory array. An example device, in which embodiments of the present invention may be implemented, may include an FPGA device, PLD device, memory device, etc.

The bit lines 202a and 202b are coupled to a leakage reduction (referred herein as a configuration cognizant leakage reduction or CCLR) circuit 204 for intelligently controlling bit line bias while the memory cell portion is idle or when the bit lines are not being used for other memory access purposes.

The CCLR circuit 204 operates to bias each bit line based on the majority state that is associated with such bit line. For instance, one of the bit lines is held to a same state as the majority state that was programmed or can be read from such majority cells. In the illustrated example, bit line 202a is coupled to each memory cell's state through such cell's respective transistor M1-M7, while bit line 202b is coupled to the complement of each memory cell's state through transistors N1-N7. As shown, transistors M1, M3, M5, M6, and M7 are coupled to bit values of "0", while transistors M2 and M4 are coupled to bit values of "1." For example, the majority bit value of "0" for the majority cells can be read or programmed via transistors M1, M3, M5, M6, and M7.

Since the majority cell bit value is "0", the CCLR circuit 204 pulls bit line 202a down to "0", while the complementary bit line 202b is pulled up to a "1" state. As a result, the majority cells do not have potential differences across their transistors (M1, M3, M5, M6, M7, N1, N3, N5, N6, and N7) and leakage current is inhibited across such transistors. Only two leakage paths for two memory cells are present: a first leakage current path through transistors N2 and M2 and a second leakage current path through transistors N4 and M4. Although the leakage current through each of these two paths is higher than if the two bit lines were both pulled high (or low), the overall number of paths and resulting leakage current for the column of memory cells is significantly reduced.

Although the illustrated example CCLR is coupled to a plurality of memory cells that share a pair of bit lines 202a and 202b, a CCLR may be coupled to a single ended bit line memory cell portion. A CCLR is coupled with each memory array portion that shares 1 or more bit lines. In a single bit line implementation, one of the bit lines (e.g., 202b) and corresponding transistors (e.g., N1-N7) would be removed.

Figure 3:
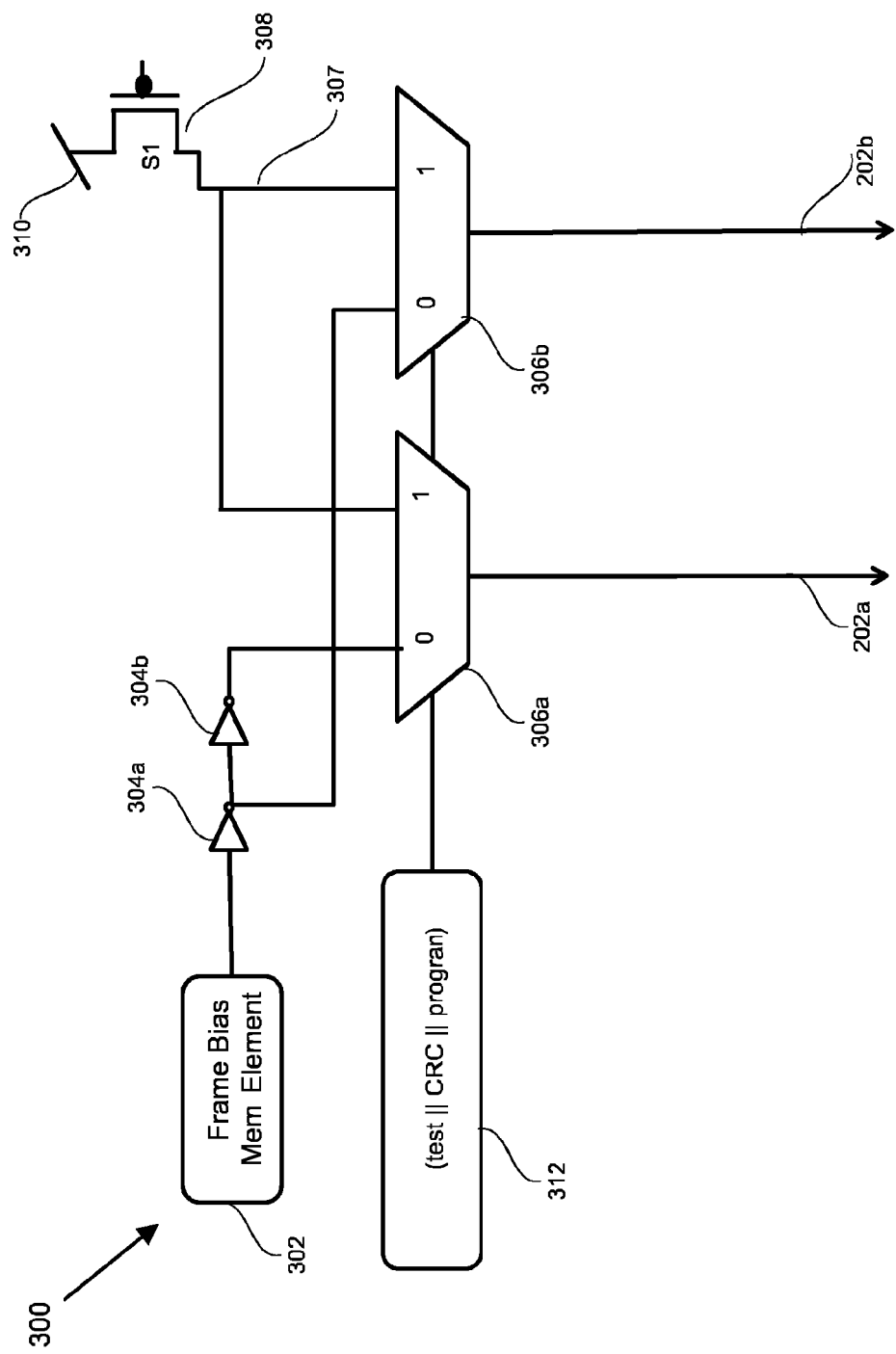
FIG. 3 is a schematic representation of a configuration cognizant leakage reduction (CCLR) circuit in accordance with a specific implementation of the present invention.

A CCLR may be implemented by any suitable combination of hardware and/or software. FIG. 3 is a schematic representation of a configuration cognizant leakage reduction circuit (CCLR) 300 in accordance with a specific implementation of the present invention. In general, the CCLR 300 is arranged to modify bit line control while the memory array is idle. That is, the CCLR 300 is active when the configurable memory array (e.g., CRAM or SRAM) is idle, and the CCLR 300 is inactive when the configurable memory array is active (e.g., during programming or reading out data).

Although the illustrated example CCLR is coupled to a plurality of memory cells that share a pair of bit lines 202a and 20b, a CCLR may be coupled to a singled-ended bit line memory cell portion. In one example single bit line implementation, one of the bit lines (e.g., 202b) and corresponding multiplexer (e.g., 306b) would be removed. In general, a CCLR is coupled with each memory array portion that shares one or more bit lines.

For each shared bit line, the CCLR receives a signal 302 that corresponds to an extra bit "Frame Bias Memory Element" for tagging the corresponding memory portion. This frame bias signal 302 indicates whether the corresponding memory portion has a majority of 1's or a majority of 0's. The frame bias signal 302 is coupled to a first multiplexer 306a through any even number of inverters (e.g., 304a and 304b), while the inverse of this frame bias signal is coupled to a second multiplexer 306b through any odd number of inverters (e.g., 304a). The multiplexers 306a and 306b both receive a pre-charge signal 307 from supply 310, for example, driven by transistor 308. The CCLR circuit 300 may also include any number of amplifier buffers or transistors (not shown) to increase the signal strength of any signal or to provide impendence matching, such as for bit line signals 202a and 202b or mux input signals.

Enable signal 312 causes the multiplexers to switch between the pre-charge signal 307 and the frame bias signal (or complement of frame bias signal) during a memory configuration/activation state and a static/idle state, respectively. A memory activation state, during which the CCLR is inhibited from selectively charging the bit lines of a particular memory cell portion, may include any suitable states in which the particular memory cell portion is being accessed and the bit lines used for such memory access. For example, the memory may be undergoing a test procedure, garbage collection, programming, erasing, reading, writing, error checking, error correction, partial configuration, partial reconfiguration, and refreshing, etc.

Of course, the bit lines may also be coupled to other circuitry (not shown), such as various multiplexers, address lines, and data lines, for causing bit values (e.g., 0 or 1) to be programmed into selected memory cells or for reading from selected memory cells. During a programming or reading operation, the pre-charge transistor is also turned off for at least part of such operation.

Figure 4:
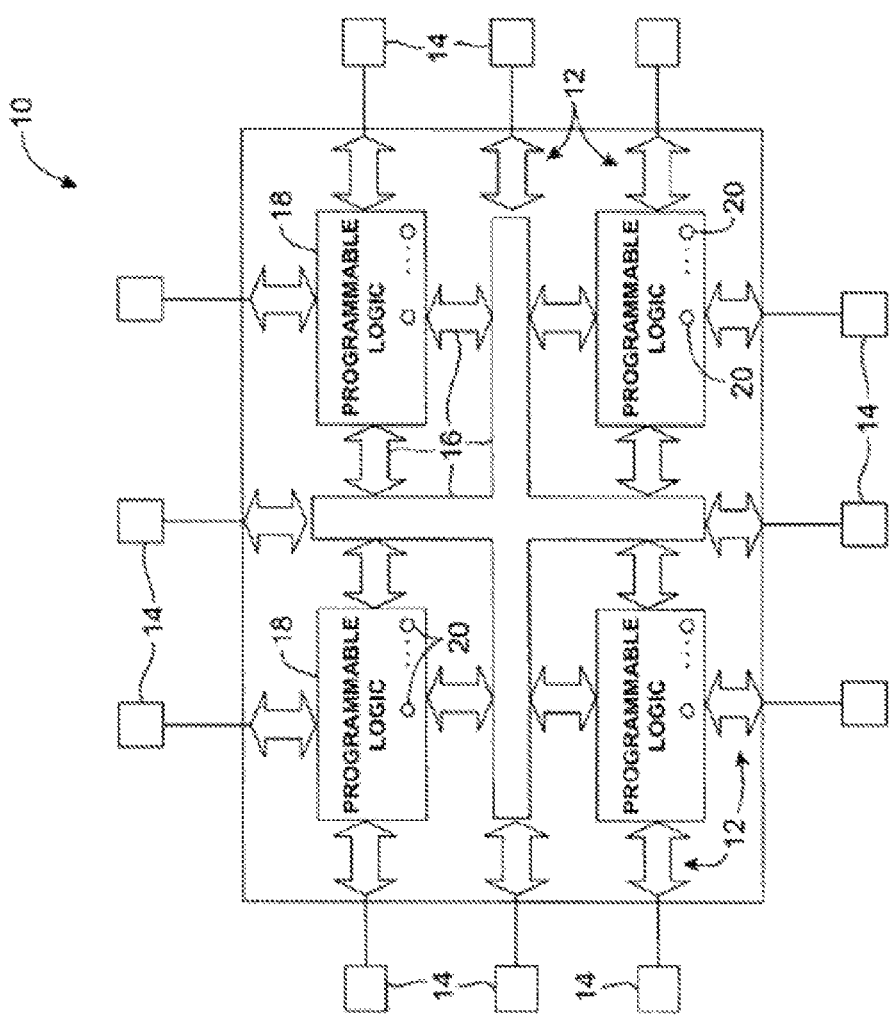
FIG. 4 is a diagram of an illustrative programmable logic device in accordance with the present invention.

Embodiments of the present invention may be utilized in relation to any device that includes memory arrays. One example is a programmable logic device (PLD). PLD's are integrated circuits that can be configured by a user to perform custom logic functions. Although embodiments of the present invention may be used in the context of any integrated circuit that has circuitry that can be configured by a user to perform a custom function, certain embodiments of the present invention are described in the context of programmable logic devices for clarity. An illustrative programmable logic device 10 in accordance with the present invention is shown in FIG. 4.

Programmable logic device 10 may have input/output circuitry 12 for driving signals off of device 10 and for receiving signals from other devices via input/output pins 14. Pins 14 may be any suitable types of pins or solder bumps for making electrical connections between the internal circuitry of device 10 and external packaging. Some of the pins 14 may be used for high-speed communications signals. Other pins may be used to provide power supply voltages to the device 10 or may be used for DC or low-frequency signals.

Interconnection resources 16 such as global and local vertical and horizontal conductive lines and busses may be used to route signals on device 10. The remainder of the circuitry 18 on device 10 includes blocks of programmable logic, memory blocks, regions of digital signal processing circuitry, processors, hardwired circuits for supporting complex communications and arithmetic functions, etc. The programmable logic in circuitry 18 may include combinational and sequential logic circuitry including logic gates, multiplexers, switches, memory blocks, look-up-tables, logic arrays, etc. These illustrative components are not mutually exclusive. For example, look-up tables and other components that include logic gates and switching circuitry can be formed using multiplexers.

Some of the logic of programmable logic device is fixed (hardwired). The programmable logic in device 10 includes components that may be configured so that device 10 performs a desired custom logic function. The programmable logic in programmable logic device 10 may be based on any suitable programmable technology. With one suitable approach, configuration data (also called programming data) may be loaded into programmable elements in the programmable logic device 10 using pins 14 and input/output circuitry 12. During normal operation of device 10, the programmable elements (also sometimes called configuration bits or configuration memory) each provide a static control output signal that controls the state of an associated logic component in the programmable logic of circuitry 18.

In a typical volatile arrangement, the programmable elements may include random-access memory (RAM) cells (e.g., CRAM or SRAM) that are loaded from an external configuration device integrated circuit via certain pins 14 and appropriate portions of input/output circuitry 12. The loaded RAM cells provide static control signals that are applied to the terminals (e.g., the gates) of circuit elements (e.g., metal-oxide-semiconductor transistors) in the programmable logic of circuitry 18 to control those elements (e.g., to turn certain transistors on or off) and thereby configure programmable logic device 10. Circuit elements in input/output circuitry 12 and interconnection resources 16 are also generally configured by the RAM cell outputs as part of the programming process (e.g., to customize I/O and routing functions). The circuit elements that are configured in input/output circuitry 12, interconnection resources 16, and circuitry 18 may be transistors such as pass transistors or parts of multiplexers, look-up tables, logic arrays, AND, OR, NAND, and NOR logic gates, etc.

RAM-based programmable logic device technology is merely one illustrative example of the type of technology that may be used to implement programmable logic device 10. Other suitable programmable logic device technologies that may be used for device 10 include one-time programmable device arrangements such as those based on programmable logic elements made from electrically-configured fuses or electrically-configured anti-fuses, programmable logic devices in which elements 20 are formed from electrically programmable read-only-memory (EPROM) or erasable electrically-programmable read-only-memory (EEPROM) technology, or programmable logic devices with programmable elements made from magnetic storage elements, or programmable logic devices with programmable elements made from phase-change materials, etc. Illustrative programmable logic elements are shown schematically as elements 20 in FIG. 4.

Regardless of the particular type of programmable element arrangement that is used for device 10, the configuration memory of device 10 is preferably provided with configuration data from a user (e.g., a logic designer). Once provided with appropriate configuration data, the configuration memory will selectively control (e.g., turn on and off) portions of the circuitry in the programmable logic device 10 and thereby customize its functions so that it will operate as desired.

The circuitry of device 10 may be organized using any suitable architecture. As an example, the logic of programmable logic device 10 may be organized in a series of rows and columns of larger programmable logic regions or areas each of which contains multiple smaller logic regions or areas (e.g., areas of logic based on look-up tables or macrocells). These logic resources may be interconnected by interconnection resources 16 such as associated vertical and horizontal interconnection conductors. Interconnection conductors may include global conductive lines that span substantially all of device 10, fractional lines such as half-lines or quarter lines that span part of device 10, staggered lines of a particular length (e.g., sufficient to interconnect several logic areas), smaller local lines that interconnect small logic regions in a given portion of device 10, or any other suitable interconnection resource arrangement. If desired, the logic of device 10 may be arranged in more hierarchical levels or layers in which multiple large areas are interconnected to form still larger portions of logic. Still other device arrangements may use logic that is not arranged in rows and columns. Portions of device 10 (e.g., in input/output circuitry 12 and elsewhere) may be hardwired for efficiency. As an example, hardwired wireless circuitry may be used to receive wirelessly-transmitted configuration data. Other hardwired communications circuitry and digital signal processing circuitry (e.g., multipliers, adders, etc.) may also be used.

A programmable logic device ("PLD") is generally a programmable integrated circuit that allows the user of the circuit, using software control, to program the PLD to perform particular logic functions. A wide variety of these devices are manufactured by Altera Corporation of San Jose, Calif. When an integrated circuit manufacturer supplies a typical programmable logic device, it is not yet capable of performing any specific function. The user, in conjunction with software supplied by the manufacturer or created by the user or an affiliated source, can program the PLD to perform a particular function or functions required by the user's application. One or more of these programmed functions can be found in what is referred to commonly as a "core" within a PLD. These cores provide compartmentalized functional blocks that can be used within a programmed PLD or other logic device. Once a logic device such as a PLD is programmed with one or more of such cores, as well as any other logic as needed, the PLD can function in a larger system designed by the user just as though dedicated logic chips were employed.

Figure 5:
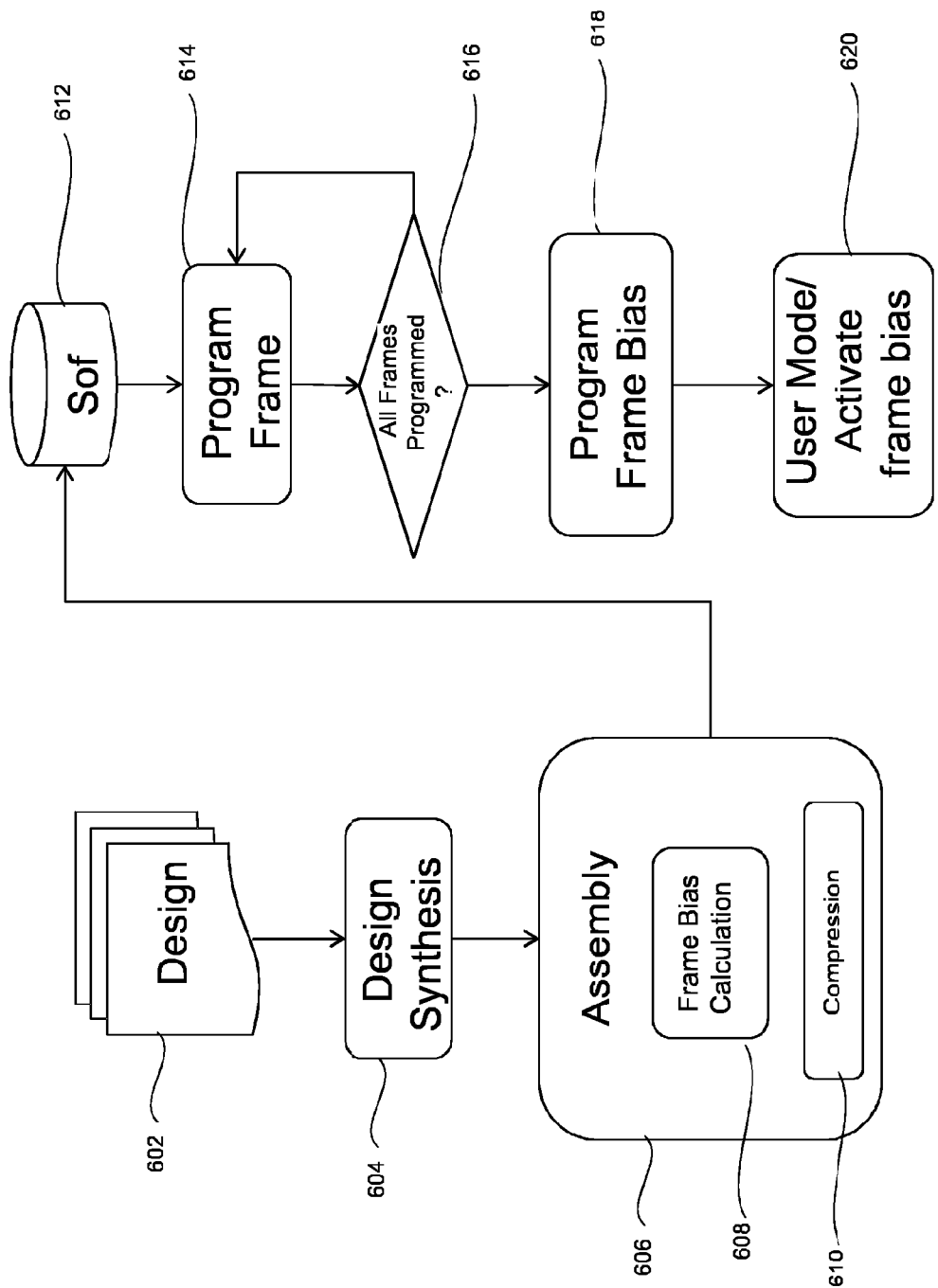
FIG. 5 is a flow chart illustrating a procedure for determining the correct frame bias to be applied to each bit line, as well as intelligently configuring a memory array to reduce leakage current, in accordance with one example implementation.

The programming of a PLD typically includes programming one or more memory arrays (RAM) of such PLD. FIG. 5 is a flow chart illustrating a procedure for determining correct frame bias settings for each memory column, as well as intelligently configuring a memory array to reduce leakage current, in accordance with one example implementation. In a typical scenario, a logic designer uses computer-aided design (CAD) tools to design a custom logic circuit by generating a plurality of electronic design files 602. These tools use information on the hardware capabilities of a given programmable logic device to help the designer implement the custom logic circuit using the resources available on that given programmable logic device. A typical design cycle (using, for example, Altera's OpenCore technology) may begin with a designer creating an initial block diagram and subsequently identifying any functions (IP) available for use in the anticipated system. The designer then can identify and evaluate one or more specific functions in terms of functionality and the range of parameterization available. After finding the appropriate function(s), the designer installs the function(s) into an electronic design and completes the design (602).

The design cycle also includes simulation of the design. Using software, one may then synthesize and simulate the functionality and performance and estimate the hardware resources in the PLD required to implement the function within the anticipated circuitry and system in operation 604. Current practice allows designers to instantiate, compile and simulate a function to verify its operation, size and performance.

In an assembly operation 606, the resulting synthesized logic design is generally assembled, resulting in a configuration file (Sof) 612, which results in a plurality of bits that will be programmed into the CRAM of the programmable device. During the assembly phase, a frame bias calculation 608 may also be used to determine the majority bit state for each set of bit lines or frame (e.g., or column of memory elements associated with a particular set of bit lines) in the programming data. For example, each bit state for the cells of each frame is counted, and the state that has the highest count is defined as the majority bit state for such frame. The majority bit state for each frame may then be used to generate a frame bias value or signal for each frame, which can be used to save power after programming of the RAM as explained further herein. This frame bias may be stored in any suitable manner. In one embodiment, the frame bias for each frame is stored as a bias bit in the particular frame's programming data.

Assembly may include any other suitable data processing functions for analyzing and/or processing the programming data. For example, assembly 608 may also include a compression operation 610.

After assembly, the programming data (e.g., Sof 612) may then be programmed into the RAM of the programmable device. The programming or configuration data may be programmed into the RAM using any suitable techniques. As shown, a first frame is programmed in operation 614. As part of programming a frame, each memory cell is programmed by selecting the corresponding word line and applying the correct bit value to one of the bit lines and the complement of the bit value to the other one of the bit lines of each frame. Since the bit lines are being used for programming, the frame value bias is not applied to the bit lines during programming.

It may then be determined whether all the frames have been programmed in operation 616. If there are more frames to program, a next frame is programmed in operation 614. Each frame continues to be programmed until all the frames have been programmed.

After all the frames are programmed, the frame bias values may then be applied to each frame's bit lines in operation 618. In this embodiment, the frame biases for all of the frames are applied to such frames after all the frames are programmed. In alternative embodiments, each frame bias value for each frame may be applied after such frame is programmed before all of the frames are programmed. This later embodiment would include individual enable signals (e.g., 312 of FIG. 3) for each frame so as to allow individual frame bias values to be applied to individual frames. However, individual enable signals may be utilized for selectively biasing bit lines of individual memory array portions for other reasons, besides programming.

In one example implementation, the frame bias for a particular frame is set to 1 when a majority of the bits of the frame have a 1 value. A bit value of 1 may correspond to a voltage or current value for a memory cell that is above a predefined memory write or read threshold value, while a 0 may corresponds to a value that is below such threshold value. The frame bias may be set to 0 when a majority of the bits of a frame have a 0 value. Said in another way, the value of a frame bias of a particular bit line matches the bit value of the majority value as it would be read out onto such bit line. The complementary bit line (if present) is set to a value that is opposite the frame bias value.

Once the RAM is programmed and all frame bias values are applied, the programmed RAM facilitates configuration of the hardware on the programmable device in order to perform their desired custom logic functions. At any time, the RAM may transition between a frame bias active mode and a memory or user mode (or memory activation state) in operation 620. By way of examples, a test, error, programming, or read mode (or the like) may commence with respect to the CRAM. During a user mode, frame bias signals are deactivated (e.g., application of frame bias signals is inhibited) with respect to the bit lines. After the user mode ends, the frame bias mode is reactivated so that frame biases are applied to associated frame bit lines.

A frame's associated frame bias may be individually applied when such frame is not in a user mode for the particular frame and while other frames are in a user mode. For instance, an error correction process may be implemented on each pair of bit lines one at a time so as to check each frame one at a time. While a particular frame is currently being checked, the frame bias for such particular frame can be the only frame bias that is removed, while other frames that are not being checked continue to have their respective frame biases applied. In this embodiment, power is saved for most of the frames, except the frame currently being checked. This same selective removal of frame bias may also be used for individual frames that are being tested, programmed, read, or otherwise selectively activated with respect to the corresponding memory frames.

Selective activation of frame bias to selected frames (or all frames) during a memory idle state will typically result in a lower number of leakage paths, as compared to techniques that pull all bit lines high during an idle state. A typical Sof file will contain a sparse amount of 1's, compared to the number of 0's. In other words, programming data will likely contain a clear majority (e.g., 90% 0's), as opposed to equal number of 1's and 0's. Thus, when the bias frame values correspond to majority bias values, fewer current leakage paths are formed (e.g., FIG. 2).

Additionally, embodiments of the present invention do not require additional voltage regulators and power rails to overdrive so as to control gate leakage. As a result, power supply size is reduced. Heat sinking requirements may also be reduced, as well as enhancing high temperature operation. Overall reliability can be increased since certain overdrive and associated stress results (e.g., oxide stress) requirements are eliminated or substantially reduced. In contrast, CCLR embodiments require minimum circuitry for each bit line. Additionally, CCLR embodiments do not affect normal memory function and are compatible with error checking and correction processes.

The disclosed techniques of the present invention may be implemented in any suitable combination of software and/or hardware system, such as a web-based server or desktop computer system. Moreover, a system implementing various embodiments of the invention may be a portable device, such as a laptop or cell phone. The apparatus and/or web browser of this invention may be specially constructed for the required purposes, or it may be a general-purpose computer selectively activated or reconfigured by a computer program and/or data structure stored in the computer. The processes presented herein are not inherently related to any particular computer or other apparatus. In particular, various general-purpose machines may be used with programs written in accordance with the teachings herein, or it may be more convenient to construct a more specialized apparatus to perform the disclosed method steps.

Figure 6:
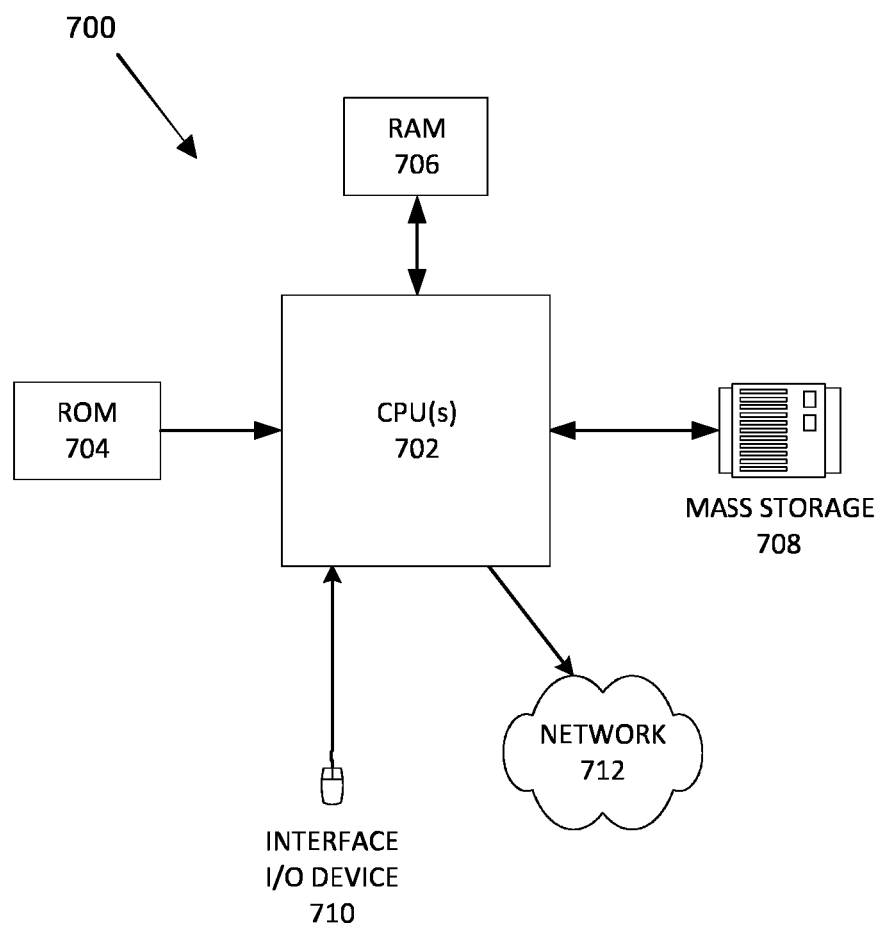
FIG. 6 is a block diagram of a typical computer system suitable for implementing an embodiment of the present invention.

FIG. 6 illustrates a typical computer system that can be used in connection with one or more embodiments of the present invention. The computer system 700 includes one or more processors 702 (also referred to as central processing units, or CPUs) that are coupled to storage devices including primary storage 706 (typically a random access memory, or RAM) and another primary storage 704 (typically a read only memory, or ROM). As is well known in the art, primary storage 704 acts to transfer data and instructions uni-directionally to the CPU and primary storage 706 is used typically to transfer data and instructions in a bi-directional manner. Both of these primary storage devices may include any suitable computer-readable media described above, including a computer program product comprising a machine readable medium on which is provided program instructions according to one or more embodiments of the present invention. A mass storage device 708 also is coupled bi-directionally to CPU 702 and provides additional data storage capacity and may include any of the computer-readable media described above, including a computer program product comprising a machine readable medium on which is provided program instructions according to one or more embodiments of the present invention. The mass storage device 708 may be used to store programs, data and the like and is typically a secondary storage medium such as a hard disk that is slower than primary storage. It will be appreciated that the information retained within the mass storage device 708, may, in appropriate cases, be incorporated in standard fashion as part of primary storage 706 as virtual memory. A specific mass storage device such as a CD-ROM may also pass data uni-directionally to the CPU.

CPU 702 also may be coupled to an interface 710 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. Finally, CPU 702 optionally may be coupled to a computer or telecommunications network using a network connection as shown generally at 712. With such a network connection, it is contemplated that the CPU might receive information from the network, or might output information to the network in the course of performing the above-described method steps. The above-described devices and materials will be familiar to those of skill in the computer hardware and software arts.

The hardware elements described above may define multiple software modules for performing one or more steps and/or operations according to embodiments of the present invention. For example, instructions for running a frame bias calculation, a design tool or any other appropriate program may be stored on mass storage device 708 or 704 and executed on CPU 702 in conjunction with primary memory 706. In synthesizing a design from a simulation version, a user may use a compiler to generate the design for implementation on hardware.

Figure 7:
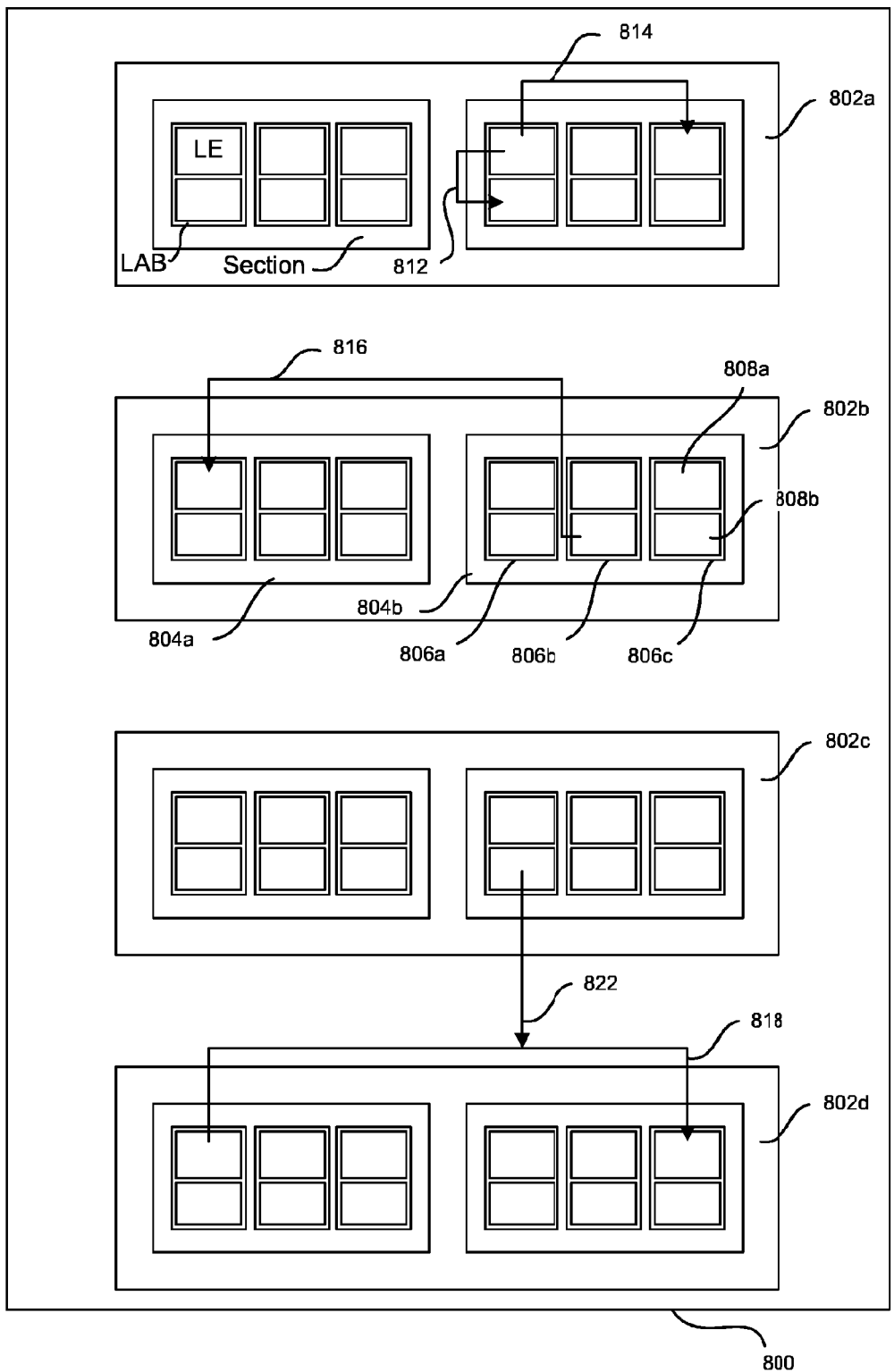
FIG. 7 is an idealized block representation of the architecture of an arbitrary hardware device, including interconnects, which may be employed in accordance with this invention.

The form of a compiled design according to one or more embodiments of the present invention may be further understood with reference to a hypothetical target hardware device having multiple hierarchical levels. Such a hardware device is represented in FIG. 7. This idealized representation roughly conforms to the layout of a FLEX 10K programmable logic device available from Altera Corporation of San Jose, Calif. In FIG. 7, a programmable logic device 800 is segmented into a plurality of "rows" to facilitate interconnection between logic elements on a given row. In the hypothetical example shown, there are four rows: 802*a*, 802*b*, 802*c*, and 802*d*.

Each row of programmable logic device 800 is further subdivided into two "half-rows." For example, row 802*b* is shown to contain a half-row 804*a* and a half-row 804*b*. The next lower level of the hierarchy is the "logic array block" (LAB). Half-row 804*b*, for example, contains three LABs: an LAB 806*a*, an LAB 806*b*, and an LAB 806*c*. Finally, at the base of the hierarchy are several logic elements. Each such logic element may exist within a single logic array block. For example, LAB 806*c* includes two logic elements: a logic element 808*a* and a logic element 808*b*.

In short, PLD 800 includes four hierarchical levels: (1) rows, (2) half-rows, (3) LABs, and (4) logic elements (LEs). Any logic element within PLD 800 can be uniquely specified (and located) by specifying a value for each of these four levels of the containment hierarchy. For example, logic element 808*b* can be specified as follows: row (2), half-row (2), LAB (3), LE (2). To fit a logic design onto a target hardware device such as that shown in FIG. 7, a synthesized netlist may be divided into logic cells (typically containing one or more gates) which are placed in the various logic elements as uniquely defined above. Thus, each logic cell from the synthesized netlist resides in a unique single logic element.

Often, a multi-level hardware hierarchy such as that shown in PLD 800 includes multiple levels of routing lines (interconnects). These connect the uniquely placed logic cells to complete circuits. In PLD 800, for example, four levels of interconnect are provided, one for each of the four hierarchy levels. First a local interconnect such as interconnect 812 is employed to connect two logic elements within the same LAB. At the next level, a LAB-to-LAB interconnect such as interconnect 814 is employed to connect two LABs within the same half-row. At the next higher level, a "global horizontal" interconnect is employed to connect logic elements lying in the same row but in different half-rows. An example of a global horizontal interconnect is interconnect 816 shown in row 802*b*. Another global horizontal interconnect is shown as interconnect 818, linking logic elements within row 802*d*. Finally, a "global vertical" interconnect is employed to link a logic element in one row with a logic element in a different row. For example, a global vertical interconnect 822 connects a logic element in the first LAB of the second half-row of row 802*c* to two separate logic elements in row 802*d*. In the embodiment shown, this is accomplished by providing global vertical interconnect 822 between the above-described logic element in row 802*c* to global horizontal interconnect 818 in row 802*d*. Consistent with the architecture of Altera Corporation's FLEX 10K CPLD, global vertical interconnects are directly coupled to the logic element transmitting a signal and indirectly coupled (through a global horizontal interconnect) to the logic elements receiving the transmitted signal.

In a target hardware device, there will be many paths available for routing a given signal line. During the routing stage, these various possible routing paths must be evaluated to determine which is best for the design being fit. Briefly, in one FLEX 10K architecture, there are at least three rows, with two half-rows per row, and twelve LABs per half-row. Each LAB includes eight logic elements each of which, in turn, includes a 4-input look-up table, a programmable flip-flop, and dedicated signal paths for carry and cascade functions. The eight logic elements in an LAB can be used to create medium-sized blocks of logic—such as 9-bit counters, address decoders, or state machines—or combined across LABs to create larger logic blocks.

It should be understood that the present invention is not limited to the Altera FLEX 10K architecture or any other hardware architecture for that matter. In fact, it is not even limited to programmable logic devices. It may be employed generically in target hardware devices as broadly defined above and preferably in application specific integrated circuit designs. PLDs are just one example of ICs that can benefit from application of the present invention.

Figure 8:
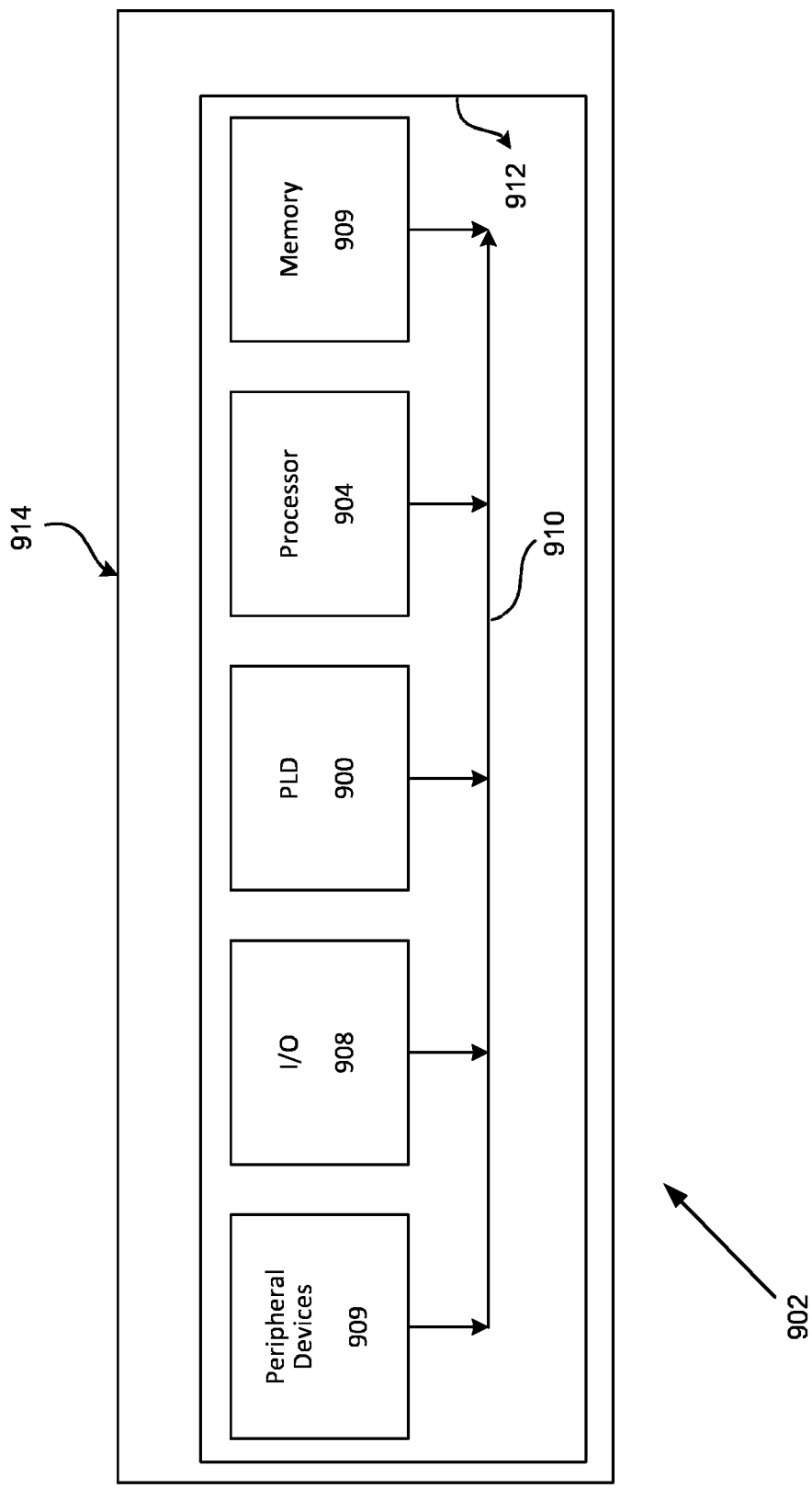
FIG. 8 is a block diagram depicting a system containing a PLD prepared in accordance with this invention.

This invention also relates to programmable logic and other devices programmed with a design prepared in accordance with the above described methods and/or using a computer program product according to one or more embodiments of the present invention. Certain embodiments may further relate to systems employing such programmable logic devices. FIG. 8 illustrates a PLD 900 of the present invention in a data processing system 902. The data processing system 902 may include one or more of the following components: a processor 904; memory 909; I/O circuitry 908; and peripheral devices 909. These components are coupled together by a system bus 910 and are populated on a circuit board 912 which is contained in an end-user system 914.

The system 902 can be used in a wide variety of applications, such as computer networking, data networking, instrumentation, video processing, digital signal processing, or any other application where the advantage of using reprogrammable logic is desirable. The PLD 900 can be used to perform a variety of different logic functions.

According to various embodiments, input may be obtained using a wide variety of techniques. For example, input for downloading or launching an application may be obtained via a graphical user interface from a user's interaction with a local application such as a mobile application on a mobile device, web site or web-based application or service and may be accomplished using any of a variety of well-known mechanisms for obtaining information from a user. However, it should be understood that such methods of obtaining input from a user are merely examples and that input may be obtained in many other ways.

Because such information and program instructions may be employed to implement the systems/methods described herein, the present invention relates to machine readable storage media that include program instructions, state information, etc. for performing various operations described herein. Examples of machine-readable storage media include, but are not limited to, magnetic media such as hard disks, floppy disks, and magnetic tape; optical media such as CD-ROM disks; magneto-optical media such as floptical disks; and hardware devices that are specially configured to store and perform program instructions, such as ROM and RAM. Examples of program instructions include both machine code, such as produced by a compiler, and files containing higher level code that may be executed by the computer using an interpreter.

Although the foregoing invention has been described in some detail for purposes of clarity of understanding, it will be apparent that certain changes and modifications may be practiced within the scope of the appended claims. Therefore, the present embodiments are to be considered as illustrative and not restrictive and the invention is not to be limited to the details given herein, but may be modified within the scope and equivalents of the appended claims.

What is claimed is:

1. A method of programming and operating a programmable memory array portion coupled with a leakage reduction circuit, the method comprising:

at the leakage reduction circuit, receiving a frame bias signal that indicates a majority state of the memory array portion; and during an idle state of the programmable memory array portion, biasing at least one bit line of the memory array portion based on the received frame bias signal, wherein the at least one bit line is shared by all memory cells in the memory array portion.

2. The method of claim 1, wherein two bit lines are shared by all memory cells in the memory array portion and such two bit lines are biased based on the received frame bias signal that indicates the majority state of the memory array portion.

3. The method of claim 2, wherein a first one of the two bit lines is biased to a first state, while the second one of the two bits lines is biased to a second state that is opposite the first state.

4. The method of claim 3, wherein the first state is a same state as the majority state of the memory array portion.

5. The method of claim 3, wherein the first state equals a state that is programmed into a majority of the memory cells.

6. The method of claim 1, further comprising inhibiting the biasing of the at least one bit line during a memory mode that utilizes at least one bit line to access one or more of the cells of the memory array portion.

7. The method of claim 6, further comprising after the memory mode ends, recommencing biasing at least one bit line of the memory array portion based on the received frame bias signal.

8. The method of claim 7, wherein the memory mode includes programming the memory array portion, reading from the memory array portion, testing the memory array portion, or error checking the memory array portion.

9. A method of programming a memory arraying having a plurality of frames that each share a first and a second bit line, the method comprising:

obtaining a programming code having a plurality of bits that are to be programmed into a plurality of frames of a memory array, wherein each frame is to be programmed with a corresponding portion of the programming code;

for each frame, determining from the frame's programming code portion a majority bit state that is to be programmed into such frame;

for each frame, setting a frame bias state based on the majority bit state that is to be programmed into such frame; and after each frame is programmed with its corresponding programming code portion, selectively applying the frame bias state for such frame to the first or second bit line of such frame and applying a complementary state of the frame bias state for such frame to another of the first or second bit line of such frame.

10. The method of claim 9, wherein the frame biases for all of the frames are selectively applied to all of the frames after all the frames are programmed.

11. The method of claim 9, wherein the frame bias state for at least one frame is selectively applied to such at least one frame after such at least one frame is programmed and prior to other frames being programmed.

12. The method of claim 9, further comprising providing the frame bias for each frame in a bit of the programming data for such frame.

13. The method of claim 9, further comprising:

after all of the frames of the memory array are programmed and each frame has a selectively applied frame bias, inhibiting application of a particular frame bias to a particular frame in response to the particular frame going into a memory mode that includes use of the frame's first and second bit lines for accessing such frame; and after the memory mode ends, recommencing application of the particular frame bias to the particular frame.

14. The method of claim 13, wherein the memory mode includes checking the particular frame for errors while not checking other frames for errors, wherein the other frame's frame biases are not inhibited.

15. The method of claim 9, further comprising:

after all of the frames of the memory array are programmed and each frame has a selectively applied frame bias, inhibiting application of each frame bias to each frame in response to the memory array going into a memory mode that includes use of any frame's first and second bit lines for accessing such frame; and after the memory mode ends, recommencing application of each frame bias to each frame.

16. A method operating a circuit to reduce leakage current in a memory array portion, the method comprising:

providing a pre-charge signal to a first input of a first multiplexer of the circuit;

on second input of the first multiplexer, receiving a frame bias signal indicating a majority of bit states for the memory array portion;

receiving an enable signal on an enable input of the first multiplexer; and outputting from the first multiplexer onto a first bit line either the frame bias signal during an idle state of the memory array portion or the pre-charge signal during an active state of the memory array portion based on the enable signal.

17. The method of claim 16, further comprising:

providing the pre-charge signal to a first input of a second multiplexer of the circuit;

on a second input of the second multiplexer, receiving a complement of the frame bias signal via an odd number of inverters of the circuit;

receiving an enable signal on an enable input of the second multiplexer;

outputting from the second multiplexer onto a second bit line either the complement of the frame bias during an idle state of the memory array portion or the pre-charge signal during an active state of the memory array portion; and outputting the frame bias signal to the first bit line and the complement of the frame bias signal to the second bit line when the memory array portion is not being accessed.

18. The method of claim 16, further comprising setting the frame bias signal so as to result in substantially no potential across each transistor that is coupled between the first bit line and a memory cell that has a majority state.

19. The method of claim 16, wherein two bit lines are shared by all memory cells in the memory array portion, the method further comprising biasing such two bit lines based on the frame bias signal that indicates the majority state of the memory array portion.

* * * * *